United States Patent [19]
Sugibayashi et al.

[11] Patent Number: 5,953,275
[45] Date of Patent: Sep. 14, 1999

[54] SEMICONDUCTOR MEMORY DEVICE HAVING SENSE AMPLIFIERS SHARED BETWEEN OPEN BIT LINE LESS AFFECTED BY ADJACENT ONES

[75] Inventors: Tadahiko Sugibayashi; Satoshi Utsugi; Masami Hanyu, all of Tokyo, Japan

[73] Assignee: NEC Corporation, Tokyo, Japan

[21] Appl. No.: 09/128,740

[22] Filed: Aug. 4, 1998

[30] Foreign Application Priority Data

Aug. 6, 1997 [JP] Japan ..................................... 9-212110

[51] Int. Cl.⁶ ....................................................... G11C 7/00
[52] U.S. Cl. .................... 365/207; 365/205; 365/189.02; 365/230.02
[58] Field of Search ......................... 365/230.03, 230.02, 365/205, 207, 189.02

[56] References Cited

U.S. PATENT DOCUMENTS 5,590,080 12/1996 Hasagawa et al. ..................... 365/207
5,596,533 1/1997 Park .................................... 365/189.02

FOREIGN PATENT DOCUMENTS 7-201170  8/1995  Japan .

*Primary Examiner*—Vu A. Le
*Attorney, Agent, or Firm*—McGinn & Gibb, P.C.

[57] ABSTRACT

A semiconductor dynamic random access memory device has first open bit lines arranged in parallel and second open bit lines respectively paired with the first open bit lines so as to form bit line pairs and a sense amplifier shared between the bit line pairs so as to increase the magnitude of a potential difference indicative of a data bit sequentially supplied from the bit line pairs, and either high or low level indicative of the data bit is supplied to both first and second bit lines of the selected bit line pair upon completion of the sense amplification, thereby equalizing electric influence on the adjacent open bit lines.

12 Claims, 15 Drawing Sheets

SEMICONDUCTOR MEMORY DEVICE HAVING SENSE AMPLIFIERS SHARED BETWEEN OPEN BIT LINE LESS AFFECTED BY ADJACENT ONES

FIELD OF THE INVENTION

This invention relates to a semiconductor memory device and, more particularly, to a semiconductor memory device having a sense amplifier shared between plural open bit line pairs.

DESCRIPTION OF THE RELATED ART

Data bits are stored in the memory cells, and are selectively read out from the memory cells. The read-out data bits are propagated through bit lines to sense amplifiers, and each sense amplifier determines the logic level on the associated bit lines through the differential amplification. Thus, the bit lines and the sense amplifiers are indispensable components for the semiconductor memory device.

Semiconductor device manufacturers have been increased the capacity of the memory cell array. One of the approaches to the large memory capacity is to miniaturize the circuit components. Accordingly, the bit lines become close to one another. However, when the bit lines are too close, cross talking becomes serious between the adjacent bit lines, and the sense amplifiers are hardly arranged on the harrow area. For this reason, it is proposed to share each sense amplifier between plural bit line pairs. Data bits on the plural but line pairs are supplied to the associated sense amplifier in a time sharing manner, and write-in data bits and read-out data bits are transferred between the plural bit line pairs and the associated sense amplifier. The semiconductor device manufacturer can reduce the sense amplifiers, and increase the bit line pairs and, accordingly, the memory cell arrays. An open bit line scheme is also conducive to the increase of memory capacity, because all the crossing points between a word line and bit lines are available for the memory cells.

However, serious cross talking takes place in the prior art semiconductor dynamic random access memory device with the shared sense amplifier and the open bit line scheme. In detail, FIG. 1 illustrates the prior art semiconductor dynamic random access memory device.

The prior art semiconductor dynamic random access memory device comprises a memory cell array split into two memory cell sub-arrays 1a/1b, and dynamic memory cells are arranged in rows and columns so as to form the memory cell sub-arrays 1a/1b. The dynamic memory cells are represented by small circles in FIG. 1, and the dynamic memory cells of one of the rows are labeled with CL0, CL1, CL2, CL3, CL4, CL5, CL6 and CL7. Bit lines BL0 to BL7 are respectively paired with bit lines CBL0 to CBL7, and the bit line pairs BL0/CBL0 to BL7/CBL7 are associated with the columns of dynamic memory cells, respectively. Word lines WL1, WL2, ... WLn and WLn+1 are connected to the rows of dynamic memory cells, respectively, and are selectively changed to active level so as to electrically connect the associated dynamic memory cells to the bit line pairs BL0/CBL0 to BL7/CBL7. The bit lines BL0–BL7/ CBL0–CBL7 are so close that parasitic capacitance Cbb between adjacent bit lines can not be ignoreable.

The prior art semiconductor dynamic random access memory device further comprises sense amplifiers SA1/SA2 and transfer gates TG0 to TGl5 connected between the sense amplifiers SA1/SA2 and the two memory cell sub-arrays 1a/1b. The sense amplifiers SA1/SA2 are associated with the bit line pairs BL0/CBL0 to BL3/CBL3 and BL4/CBL4 to BL7/CBL7, respectively, and increase the magnitude of potential difference on the associated bit line pairs. The transfer gates TG0 to TG3 and TG4 to TG7 are paired with the transfer gates TG8 to TG11 and TG12 to TGl5, and the transfer gate pairs TG0/TG8, TG11/TG9, TG2/TG10 and TG3/TG11 and the other transfer gate pairs TG4/TG12, TG5/TG13, TG6/TG14 and TG7/TG15 are connected to the sense amplifier SA1 and the sense amplifier SA2, respectively. The transfer gates TG0 to TG15 are selectively gated by four control lines TGS0, TGS0, TGS2 and TGS3. In this instance, the control lines TGS0, TGS1, TGS2 and TGS3 are respectively connected to the transfer gates TG0/TG8/TG4/ TG12, TG1/TG9/TG51 TG13, TG2/TG0/TG6/TG14 and TG3/TG11/TG7/TG15.

Subsequently, description is made on the behavior of the prior art semiconductor dynamic random access memory device on the assumption that the memory cells CL0/CL2/ CL4 and the memory cells CL1/CL3/CL5/CL6/CL7 store data bits of logic "1" level and data bits of logic "0" level with reference to FIG. 2. The data bit of logic "1" changes the associated bit line to high level, and the data bit of logic "0" causes the associated bit line to go down. The bit line pairs have been already equalized at a precharge level Vpc. The word line WL0 starts to rise at time t0, and the dynamic memory cells CL0 to CL7 are electrically connected to the associated bit lines BL0 to BL7, respectively. The data bits stored in the memory cells CL0/CL2/CL4 cause the associated bit lines BL0/BL2/BL4 to go up, and the data bits stored in the memory cells CL1 CL3/CL5/CL6/CL7 cause the associated bit lines BL1/BL3/BL5/BL6/BL7 to go down at time t1. The bit lines CBL0–CBL7 are maintained at the precharge level Vpc, and potential differences ΔV takes place between the bit lines BL0–BL7 and the bit lines CBL0–CBL7, respectively. The potential differences ΔV are representative of the read-out data bits.

Subsequently, the control lines TG0 to TG3 are sequentially changed to the active level, and the potential differences ΔV are successively subjected to the differential amplification. In detail, the control line TG0 is firstly changed to the active level, and the transfer gate pairs TG0/TG8 and TG4/TG12 turn on so as to connect the bit line pairs BL0/CBL0 and BL4/CBL4 to the sense amplifiers SA1/SA2, respectively. The potential differences ΔV are supplied from the bit lines pairs BL0/CBL0 and BL4/CBL4 to the sense amplifiers SA1/SA2, respectively, and the sense amplifiers SA1/SA2 increase the potential differences from ΔV to ΔLV at time t2. The data bits read out from the memory cells CL0/CL4 are represented by high level Vh of the potential differences ΔLV. Although the potential differences ΔLV are propagated along the bit line pairs BL0/CBL0 and BL4/CBL4, only the word line WL0 is in the active high level, and the read-out data bits Vh are restored in the memory cells CL0 and CL4, respectively.

While the bit line pairs BL0/CBL0 and BL4/CBL4 propagate the potential differences ΔLV, the bit line pairs BL1/ CBL1, BL3/CBL3 and BL5/CBL15 are affected by the potential differences ΔLV due to the parasitic capacitance Cbb as indicated by arrows, and a noise component σ is induced on each of the adjacent bit lines BL1/CBL1, BL3/ CBL3 and BL5/CBL5. In other word, the bit line BL1 is affected by the noise component σ, and the associated bit line CBL1 is also affected by the noise component σ. As a result, each of the potential difference ΔV on the adjacent bit line pair BL1/CBL1, BL3/CBL3 or BL5/CBL5 is decreased by 2σ.

Upon completion of the data restoring, the control line TG0 is changed to the inactive level, and the control line TG1 is changed to the active level so as to repeat the above described data restoring for the data bits stored in the memory cells CL1/CL5.

If the control line is sequentially changed to the active level from TG0 through TG1 and TG2 to TG3, the potential difference ΔV on the bit line pair BL3/CBL3 are twice affected by the noise component 2σ from the adjacent bit line pairs BL4/CBL4 and BL2/CBL2. For this reason, the reduction of potential difference is serious.

In order to prevent bit lines from adjacent bit lines, Japanese Patent Publication of Unexamined Application No. 7-201170 proposes to sandwich a bit line just propagating a data bit between bit lines, which has already propagated data bits. FIG. 3 illustrates the prior art semiconductor dynamic memory device disclosed in the Japanese Patent Publication of Unexamined Application. In FIG. 3, dynamic memory cells are represented by small circles, and only four dynamic memory cells are labeled with C0n, C1n, C2n and C3n, respectively. Word lines WL1/WL2 are selectively connected to the dynamic memory cells, and bit lines BL3(n−1)/BL0n/BL1n/BL2n/BL3n/BL0(n+1) are further selectively connected to the dynamic memory cells. Sense amplifiers 10a/10b/10c are provided for the differential amplification, and transfer gates TG10/TG11 are connected between the bit lines BL3(n−1) to BL0(n+1) and the sense amplifiers 10a/10b/10c. The bit lines BL0n/BL2n are connected to the bit lines BL1n/BL3n between the transfer gates TG10/TG11 and the sense amplifiers 10a/10b/10c. Control lines P1/P2 are connected to the gate electrodes of the transfer gates TG10 and TG11, and are selectively changed to active level.

Assuming now that the word line WL1 is changed to the active level, the associated dynamic memory cells C0n/C1n . . . are electrically connected to the bit lines BL0n/BL1n/BL0(n+1), and the read-out data bits slightly lift or decay the potential level on the associated bit lines. However, the word line WL2 remains at the inactive level, and the bit lines BL3(n−1)/BL2n/BL3n are maintained at the precharge level.

The control line P1 is firstly changed to the active level, and the transfer gates TG10 turn on. Then, the bit lines BL0n and BL2n are connected to the sense amplifier 10b, and the sense amplifier 10b increases the magnitude of the potential difference. Either high or low level is propagated through the bit line BL0n to the memory cell C0n, and the bit line BL2n propagates the other potential level. The bit line BL1n is affected by the increased potential levels on the bit lines BL0n and BL2n. However, the electrical influence from the bit line BL0n is canceled with the electrical influence from the bit line BL2n, and the noise from the bit line pair BL0n/BL2n is negligible. For this reason, the bit line pair BL1n/BL3n properly maintains the potential difference over the minimum potential difference sensible by the sense amplifier 10b. When the control line P2 is changed to the active level, the sense amplifier 10b increases the potential difference.

The prior art bit line arrangement shown in FIG. 3 is effective against the noise due to the capacitive coupling between the bit lines in so far as the bit lines of each pair extend on the same side of the sense amplifiers. The prior art bit line arrangement is called as "folded bit lines". However, the bit lines on one side of the sense amplifiers are respectively paired with the bit lines on the other side of the sense amplifiers in the open bit line scheme. For this reason, it is impossible to apply Shiratake's concept to the open bit line scheme. Thus, the open bit lines are still affected by the noise from the adjacent open bit lines.

SUMMARY OF THE INVENTION

It is therefore an important object of the present invention to provide a semiconductor memory device, which has a shared sense amplifier and open bit lines less affected by noise from adjacent open bit lines.

In accordance with one aspect of the present invention, there is provided a semiconductor memory device comprising a plurality of first addressable memory cells forming at least two first memory cell sub-arrays and storing data bits, respectively, a plurality of word lines selectively connected to the plurality of first addressable memory cells for selecting certain first addressable memory cells from one of the at least two first memory cell sub-arrays, at least one first sense amplifier having a first node and a second node for amplifying a potential difference representative of a data bit between the first node and the second node, a plurality of first bit lines selectively connected to the first addressable memory cells of one of the at least two first memory cell sub-arrays and providing essential parts of first signal propagation paths connected between the certain first addressable memory cells and the first node of the at least one first sense amplifier, a plurality of second bit lines selectively connected to the first addressable memory cells of the other of the at least two first memory cell sub-arrays, providing essential parts of second signal propagating paths connected between the certain first addressable memory cells and the second node of the at least one first sense amplifier and respectively paired with the plurality of first bit lines so as to form first bit line pairs, a first transfer gate array forming fist additional parts of the first signal propagation paths and selectively connecting the plurality of first bit lines to the first node of the at least one first sense amplifier, a second transfer gate array forming second additional parts of the second signal propagation paths and selectively connecting the plurality of second bit lines to the second node of the at least one first sense amplifier, a first switching means inserted into the first signal propagation paths and changed between on-state and off-state, a second switching means inserted into the second signal propagation paths and changed between the on-state and the off-state and a controller connected to the first transfer gate array, the second transfer gate array, the first switching means and the second switching means and operative to cause the first transfer gate array and the second transfer gate array to sequentially connect the first bit line pairs to the first and second nodes of the at least one first sense amplifier and independently control the first switching means and the second switching means between the on-state and the off-state so as to electrically isolate either first or second bit line of selected one of the first bit line pairs from the associated first or second node of the at least one first sense amplifier.

BRIEF DESCRIPTION OF THE DRAWINGS

The features and advantages of the semiconductor memory device will be more clearly understood from the following description taken in conjunction with the accompanying drawings in which.

DESCRIPTION OF THE PREFERRED EMBODIMENTS

First Embodiment

Figure 1:
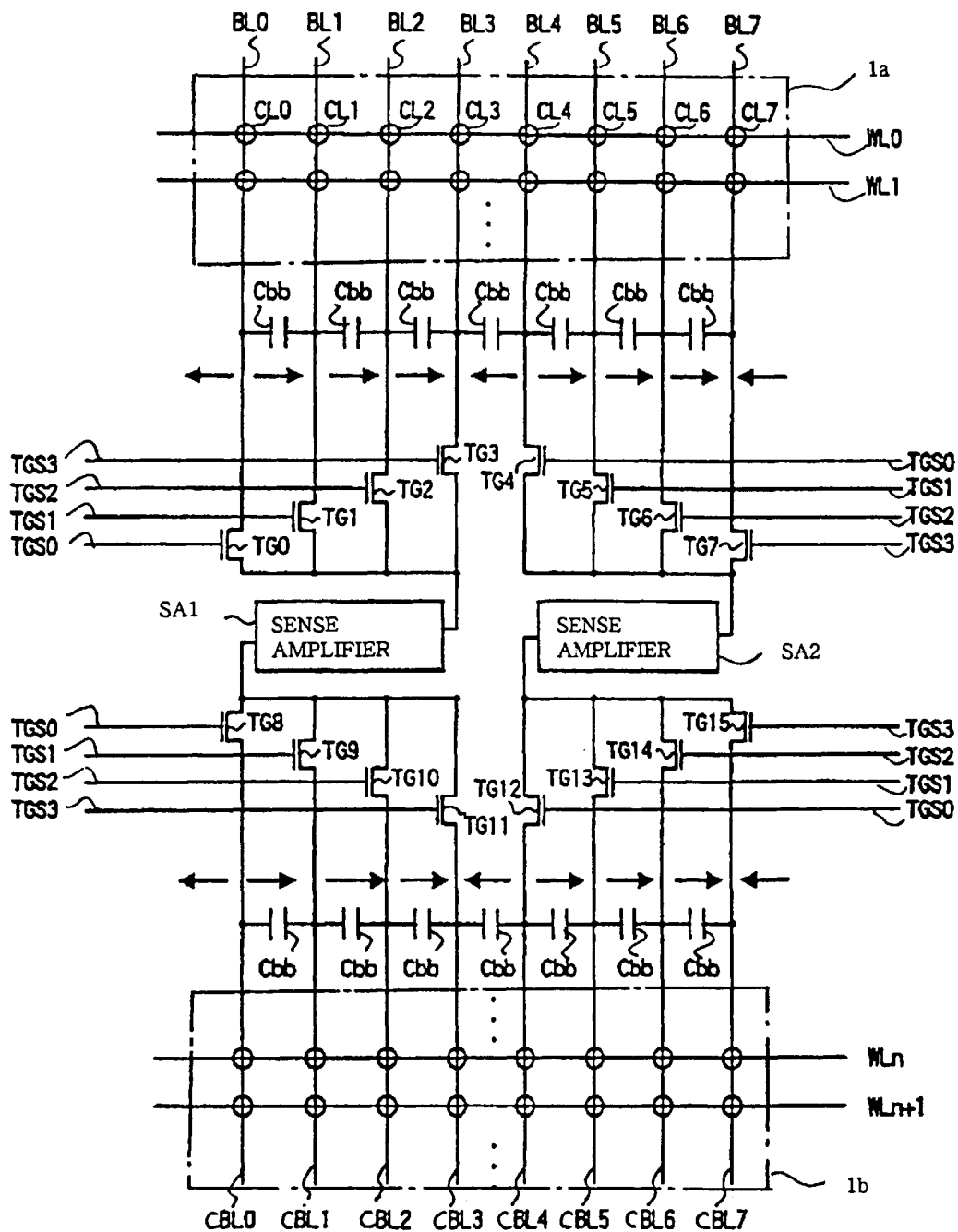
FIG. 1 is a circuit diagram showing the arrangement of the prior art semiconductor memory device.
Figure 2:
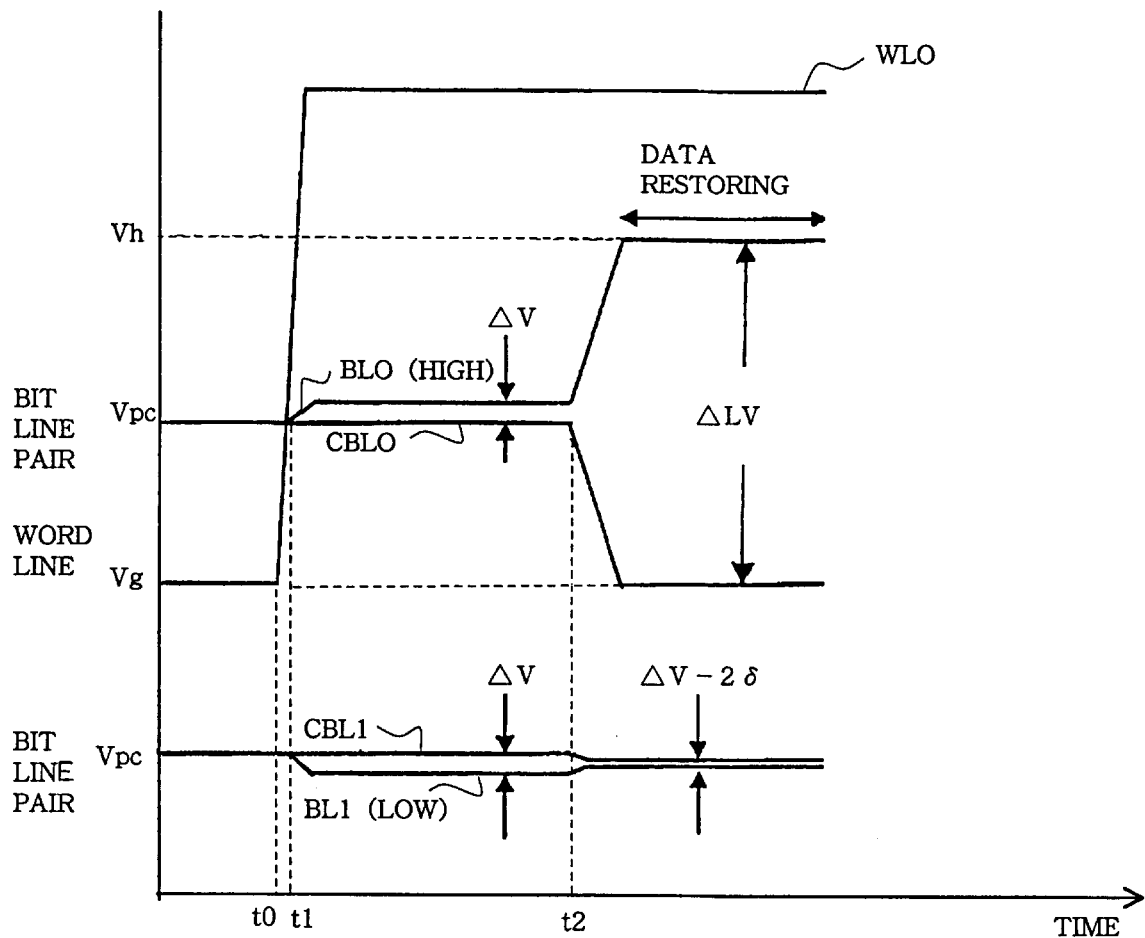
FIG. 2 is a graph showing the potential levels on the selected word line and the bit line pairs during the data read-out.
Figure 3:
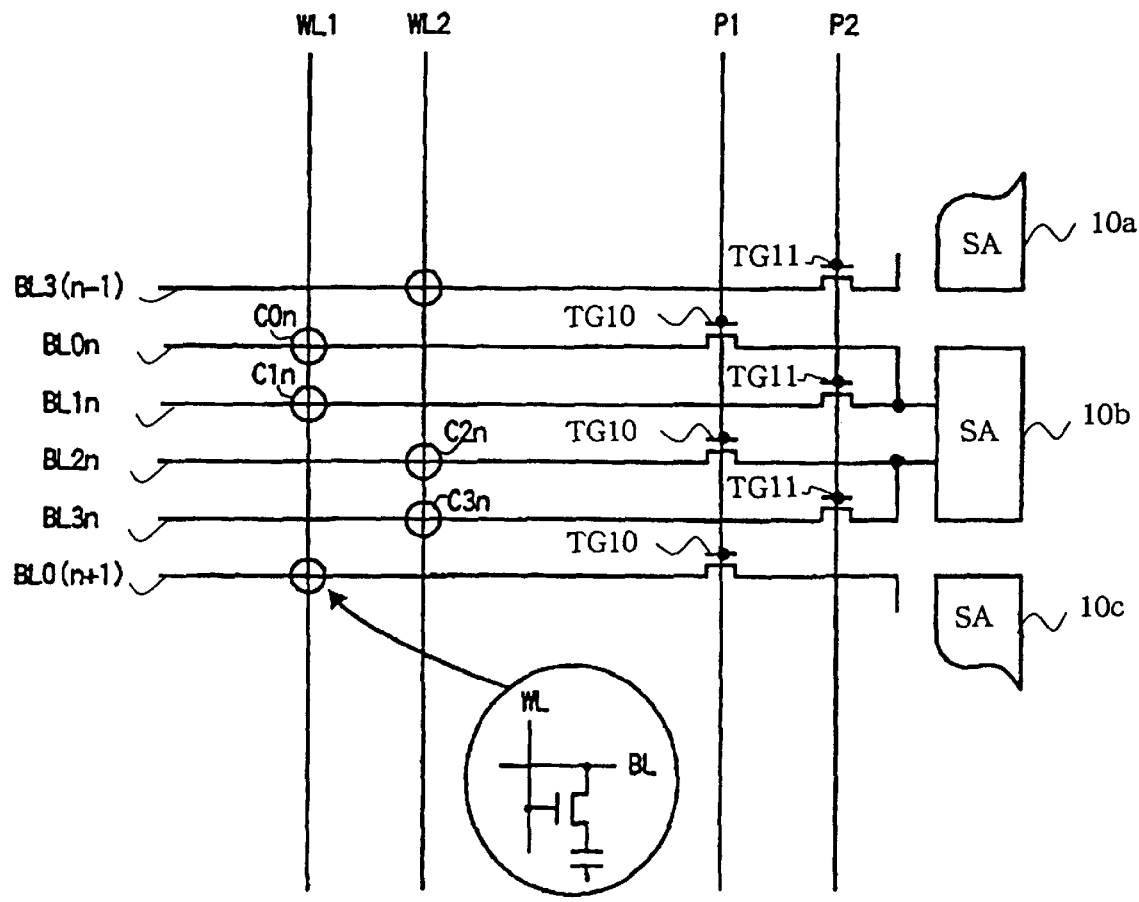
FIG. 3 is a circuit diagram showing the arrangement of the prior art semiconductor memory device disclosed in Japanese Patent Publication of Unexamined Application No. 7-201170.
Figure 4:
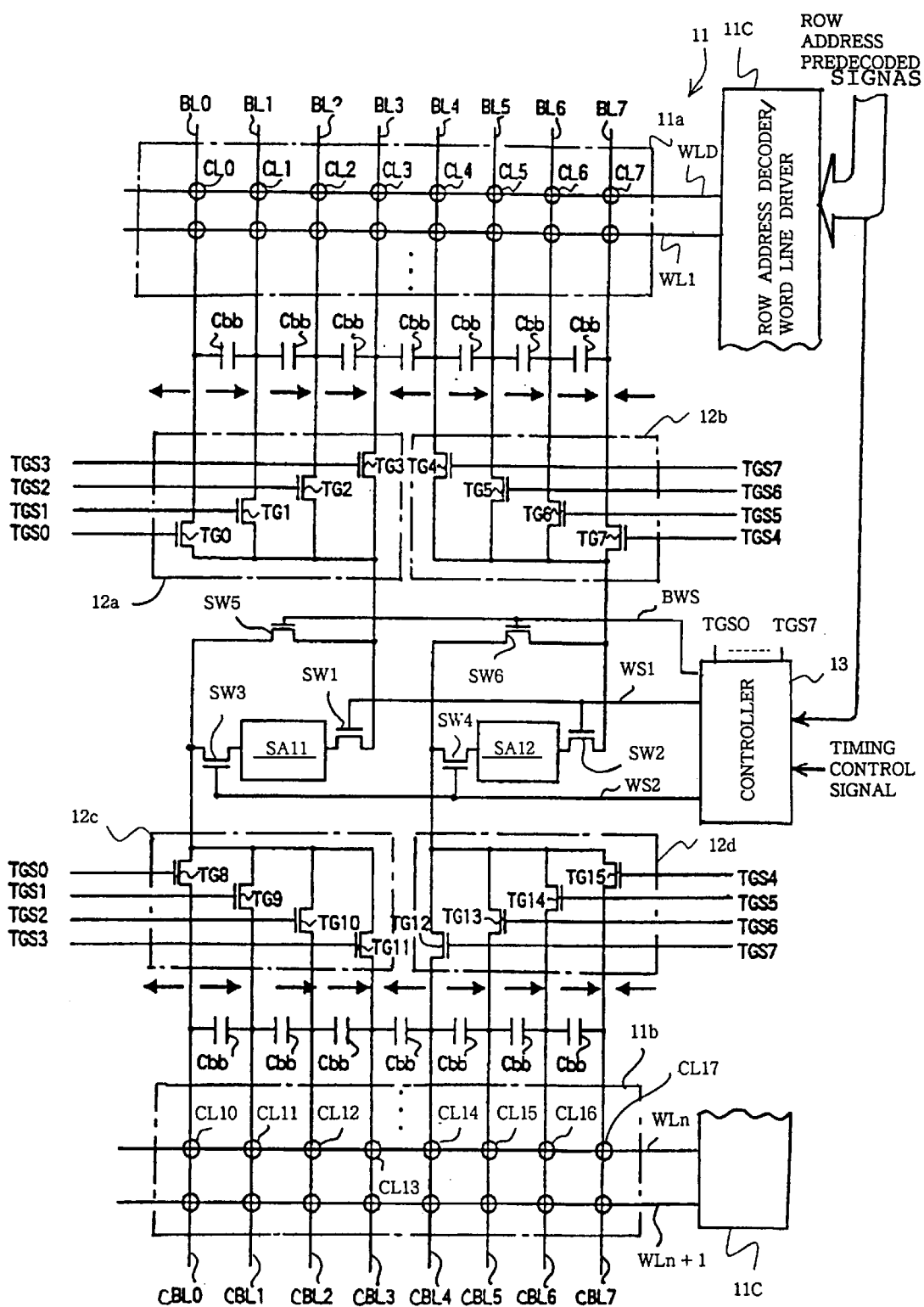
FIG. 4 is a circuit diagram showing the arrangement of a semiconductor dynamic random access memory device according to the present invention.

Referring first to FIG. 4 of the drawings, a semiconductor dynamic random access memory device embodying the present invention comprises a memory cell array 11 split into two memory cell sub-arrays 11a/11b, and dynamic memory cells are arranged in rows and columns so as to form the memory cell sub-arrays 11a/11b. The dynamic memory cell is implemented by a series of n-channel enhancement type access transistor and a storage capacitor. The dynamic memory cell is well known to person skilled in the art, and no further description is incorporated hereinbelow for the sake of simplicity. The dynamic memory cells are represented by small circles, and the dynamic memory cells of one of the rows are labeled with CL0, CL1, CL2, CL3, CL4, CL5, CL6 and CL7. Another row of dynamic memory cells are respectively labeled with CL10, CL11, CL12, CL13, CL14, CL15, CL16 and CL17.

The semiconductor dynamic random access memory device further comprises bit lines BL0–BL7/CBL0–CBL7, word lines WL0, WL1, . . . WLn and WLn+1 and a row address decoder/word line driver 11c. The bit lines BL0 to BL7 are respectively paired with the bit lines CBL0 to CBL7, and the bit line pairs BL0/CBL0 to BL7/CBL7 are associated with the columns of dynamic memory cells, respectively. Each bit line is connected to the drain nodes of the n-channel enhancement type access transistors of the associated column. The word lines WL1, WL2, . . . WLn and WLn+1 are associated with the rows of dynamic memory cells, respectively, and each word line is connected to the gate electrodes of the n-channel enhancement type switching transistors of the associated row. The row address decoder/word line driver 11c is connected to the word lines WL0 to WLn+1, and is responsive to row address predecoded signals so as to selectively change the word lines WL0 to WLn+1 to active level. The bit lines BL0–BL7/CBL0–CBL7 are so close to one another that they are capacitively coupled through parasitic capacitors Cbb, and the capacitance Cbb are not ignoreable.

The semiconductor dynamic random access memory device further comprises sense amplifiers SA11/SA12, transfer gate arrays 12a/12b/12c/12d connected between the sense amplifiers SA11/SA12 and the bit lines BL0–BL3, BL4–BL7, CBL0–CBL3 and CBL4–CBL7 and n-channel enhancement type switching transistors SW1/SW2/SW3/SW4.

The transfer gate array 12a has transfer gates TG0/TG1/TG2/TG3, and is responsive to gate control signals TGS0/TGS1/TGS2/TGS3 so as to selectively connect the bit lines BL0–BL3 through the n-channel enhancement type switching transistor SW1 to one input node of the sense amplifier SA11. The transfer gate array 12b has transfer gates TG4/TG5/TG6/TG7, and is responsive to gate control signals TGS4/TGS5/TGS6/TGS7 so as to selectively connect the bit lines BL4–BL7 through the n-channel enhancement type switching transistor SW2 to one input node of the sense amplifier SA12.

The transfer gate array 12c has transfer gates TG8/TG9/TG10/TG11, and is responsive to gate control signals TGS0/TGS1/TGS2/TGS3 so as to selectively connect the bit lines CBL0–CBL3 through the n-channel enhancement type switching transistor SW3 to the other input node of the sense amplifier SA11. The transfer gate array 12d has transfer gates TG12/TG13/TG14/TG15, and is responsive to gate control signals TGS4/TGS5/TGS6/TGS7 so as to selectively connect the bit lines CBL4–CBL7 through the n-channel enhancement type switching transistor SW4 to the other input node of the sense amplifier SA12. Thus, the transfer gate arrays 12a/12c selectively connect the bit line pairs BL0/CBL0–BL3/CBL3 to the sense amplifier SA11, and the transfer gate arrays 12b/12d selectively connect the bit line pairs BL4/CBL4–BL7/CBL7 to the other sense amplifier SA12. In other words, the sense amplifier SA11 is shared between the bit line pairs BL0/CBL0–BL3/CBL3, and the other sense amplifier SA12 is shared between the bit line pairs BL4/CBL4–BL7/CBL7. Control signal lines WS1/WS2 are connected to the gate electrodes of the n-channel enhancement type switching transistors SW1/SW2 and the gate electrodes of the n-channel enhancement type switching transistors SW3/SW4.

The semiconductor dynamic random access memory device further comprises an n-channel enhancement type switching transistor SW5 connected between the n-channel enhancement type switching transistors SW1 and SW3, an n-channel enhancement type switching transistor SW6 connected between the n-channel enhancement type switching transistors SW2 and SW4 and a controller 13. The n-channel enhancement type switching transistors SW5/SW6 are gated by a control signal line BWS. The controller 13 is connected to the control signal lines SW1/WS2/BWS and control signal lines TGS0–TGS7, and is responsive to a timing control signal and one of the row address predecoded signal indicative of the word lines associated with the memory cell sub-array 11a or 11b so as to selectively change the control signal lines WS1, WS2 and BWS as will be described hereinlater. The controller 13 is further operative to sequentially change the gate control signal lines TGS0 to TGS7. Though not shown in FIG. 4, the sense amplifiers SA11/SA12 are connected through a column address decoder/selector to an input/output circuit.

In this instance, the n-channel enhancement type switching transistor SW1/SW2 and the n-channel enhancement type switching transistor SW3/SW4 serve as a first switching means and a second switching means, respectively.

Figure 5:
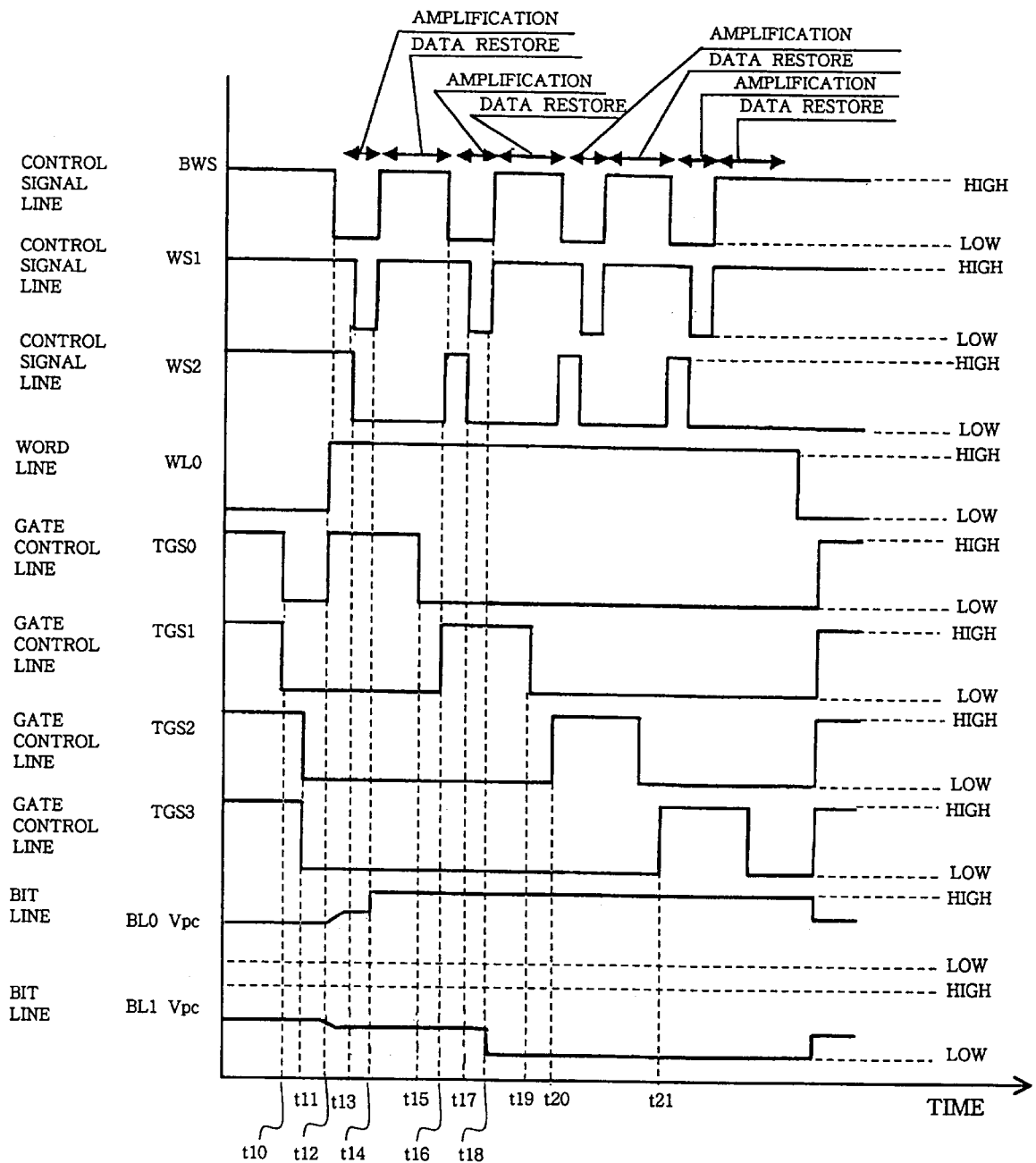
FIG. 5 is a timing chart showing a sequential data transfer between bit line pairs and a sense amplifier.

The semiconductor dynamic random access memory device behaves as follows. FIG. 5 illustrates a sequential data transfer between the bit line pairs BL0/CBL0–BL3/CBL3 and the sense amplifier SA11. The sequential data transfer is required for a data access and a data refresh. Description is focused on the bit line pairs BL0/CBL0 to BL3/CBL3 for the sake of simplicity.

The dynamic memory cells CL0 and CL1 are assumed to store a data bit of logic "1" level and a data bit of logic "0" level, respectively. The data bit of logic "1" level lifts the potential level on the associated bit line, and the data bit of logic "0" level decays the potential level on the associated bit line . The control signal lines BWS/WS1/WS2 and the gate control signals TGS0–TGS3 are in the high level, and the bit line pairs BL0/CBL0–BL3/CBL3 have been balanced at a precharge level between the high level and the low level.

First, the gate control lines TGS0/TGS1 go down to the low level at time t10, and the gate control lines TGS2/TGS3 go down to the low level at time t11.

The control signal line BWS is changed to the low level at time t12, and the n-channel enhancement type switching transistors SW5 turns off so as to electrically isolate the transfer gate array 12a from the transfer gate array 12c. The word line WL0 is changed to the high level, and data bits are read out from the memory cells CL0 to CL3 to the bit lines BL0 to BL3, respectively. The read-out data bits slightly pulls up and down the potential levels on the bit lines BL0 to BL3. However, the other word lines remains inactive, and the bit lines CBL0–CBL3 are maintained at the precharge level Vpc. Only the gate control line TGS0 was changed to the high level concurrently with the word line WL0, and the transfer gates TG0/TG8 turned on. For this reason, small potential difference on the bit line pair BL0/CBL0 is transferred through the transfer gates TG0/TG8 and the n-channel enhancement type switching transistors SW1/SW3 to the sense amplifier SA11.

The control signal lines WS1/WS2 are changed to the inactive low level at time t13, and the sense amplifier SA11 is electrically isolated from the bit line pair BL0/CBL0. The sense amplifier SA11 is activated so as to increase the magnitude of the potential difference.

The control signal lines BWS/WS1 are changed to the active high level at time t14, and the n-channel enhancement type switching transistors SW1/SW5 turn on. Then, the one input node of the sense amplifier SA 11 is electrically connected through the transfer gate arrays 12a/12c to the bit lines BL0/CL0 of the pair. As a result, bot bit lines BL0/CBL0 are lifted to the high level. The high level on the bit line BL0 is restored in the memory cell CL0. However, the high level on the bit line CBL0 does not affect the data bits stored in the dynamic memory cells of the memory cell sub-array 11b. The gate control line TGS0 is changed to the inactive low level at time t15, and the bit line pair BL0/CBL0 is electrically isolated from the sense amplifier SA11.

The sense amplifier SA11 supplies either high or low voltage representative of the read-out data bit to both of the bit lines BL0 and CBL0, and the adjacent bit lines BL1/CBL1 are equally affected by the noise due to the high/low voltage. For this reason, the small potential differences on the adjacent bit line pairs are merely moved upwardly or downwardly, and the magnitude is not reduced. The influence of the noise will be described hereinbelow in detail.

The control signal line BWS goes down at time t16, and the n-channel enhancement type switching transistor SW5 turns off. The control signal line WS2 and the gate control line TGS1 are concurrently changed to the active high level. The n-channel enhancement type switching transistor SW3 turns on, and the transfer gates TG1/TG9 turn on so as to supply the small potential difference on the bit line pair BL1/CBL1 to the sense amplifier SA11.

The control signal lines WS1/WS2 are changed to the inactive low level at time tl7, and the n-channel enhancement type switching transistors SW1/SW3 turn off so as to isolate the sense amplifier SA11 from the bit line pair BL1/CBL1.

The control signal lines BWS/WS1 are changed to the active high level at time tl8, and the n-channel enhancement type switching transistors SW1/SW5 turn on so as to connect one node to both of the bit lines BL1/CBL1. Then, the bit lines BL1/CBL1 are decayed to the low level, and the adjacent bit line pairs BL0/CBL0 and BL2/CBL2 are equally affected by the noise due to the low level on the bit line pairs BL1/CBL1.

The gate control signal TGS1 is changed to the inactive low level at time t19, and the bit line pair BL1/CBL1 are isolated from the sense amplifier SA11.

Similarly, the read-out data bits on the bit line pairs BL2/CBL2 and BL3/CBL3 are supplied to the sense amplifier at time t20 and time t21, respectively, and the n-channel enhancement type switching transistors SW1/SW2/SW5 are controlled as described hereinbefore so as to supply either high or low level to both bit lines.

If the word line WLn/WLn+1 is selected, the controller 13 causes the sense amplifier SA11 to supply either high or low level from the other input node to both of the bit lines. Although the description is focused on the sense amplifier SA11 only, the other sense amplifiers such as SA12 are similarly controlled, and the read-out data bits read out from the memory cells CL4–CL7 are processed in parallel to the data bits read out from the memory cells CL0–CL3.

Figure 6:
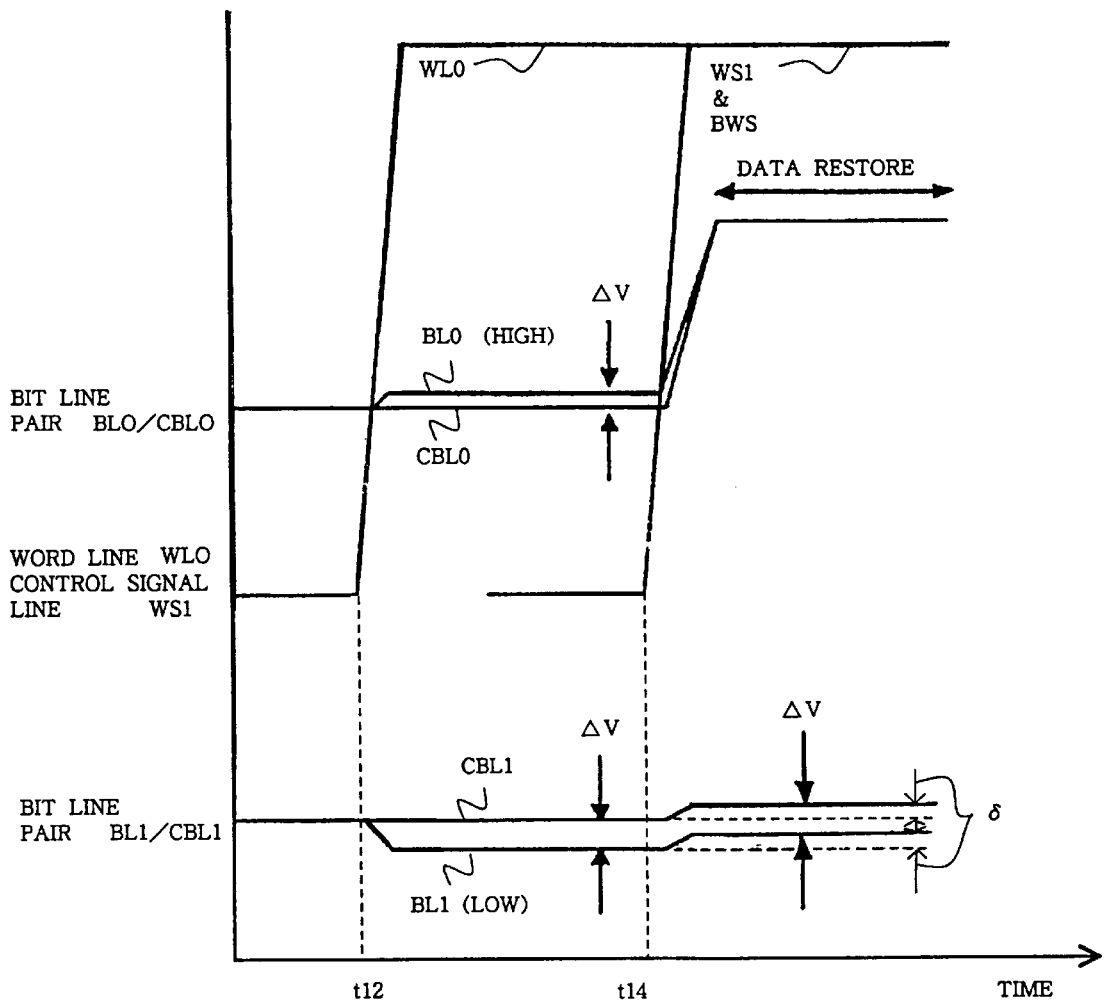
FIG. 6 is a graph showing the potential levels on adjacent two bit line pairs.

FIG. 6 illustrates the electrical influence of the bit line pair BL0/CBL0 on the adjacent bit line pair BL1/CBL1. As described hereinbefore, when the word line WL0 is changed to the active high level, the small potential differences n-channel enhancement type switching transistor ΔV takes place on the bit line pairs BL0/CBL0 and BL1/CBL1, respectively. The control signal lines BWS/WS1 are changed to the active high level at time t14, and the high voltage level indicative of the read-out data bit is supplied from the sense amplifier SA11 to both bit lines BL0/CBL0. The bit lines BL0/CBL0 rise, and induce noise σ on the adjacent bit lines BL1/CBL1. Although the noise σ lifts the potential level on the bit line BL1 and the potential level on the bit line CBL1, the potential levels are moved in the same direction, and the bit line pair BL1/CBL1 keeps the small potential difference ΔV. Thus, although the noise σ takes place on the bit lines BL0/CBL0 due to the data restoring, the noise σ raises the potential level on the bit line BL1 and the potential level on the bit line CBL1 in the same direction, and the adjacent bit line pair BL1/CBL1 keeps the original small potential difference ΔV. In other words, the controller 13 and the n-channel enhancement type switching transistors SW1/SW3/SW5 eliminate the influence of the noise from the adjacent bit line pairs.

Second Embodiment

Figure 7:
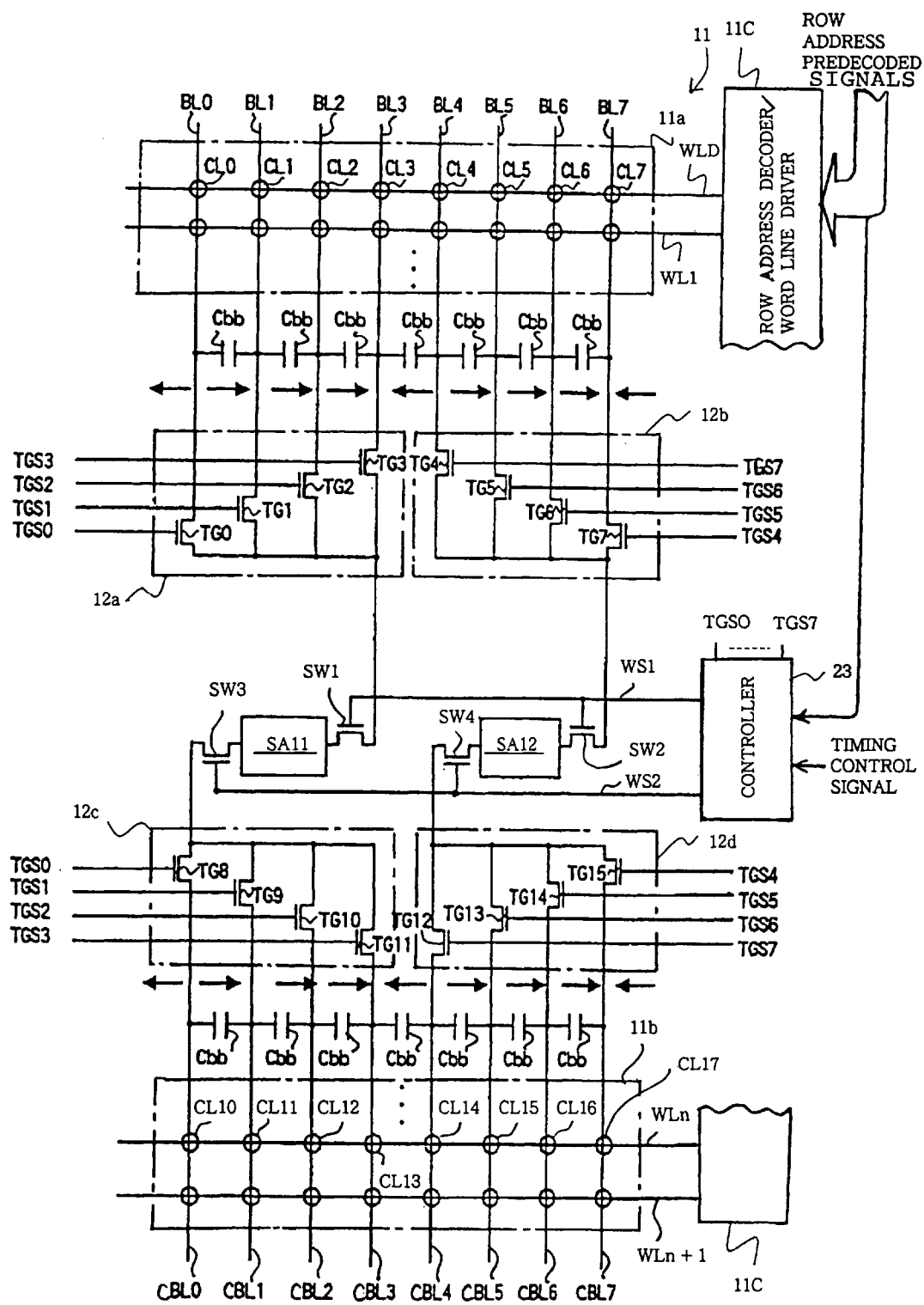
FIG. 7 is a circuit diagram showing the arrangement of another semiconductor dynamic random access memory device according to the present invention.

FIG. 7 illustrates another semiconductor dynamic random access memory device embodying the present invention.

The semiconductor dynamic random access memory device implementing the second embodiment is similar in arrangement to the first embodiment except for the n-channel enhancement type switching transistors SW5/SW6 and the control signal line BWS. The n-channel enhancement type switching transistors SW5/SW6 are deleted from the second embodiment, and a controller 23 does not changes the control signal line BWS.

Figure 8:
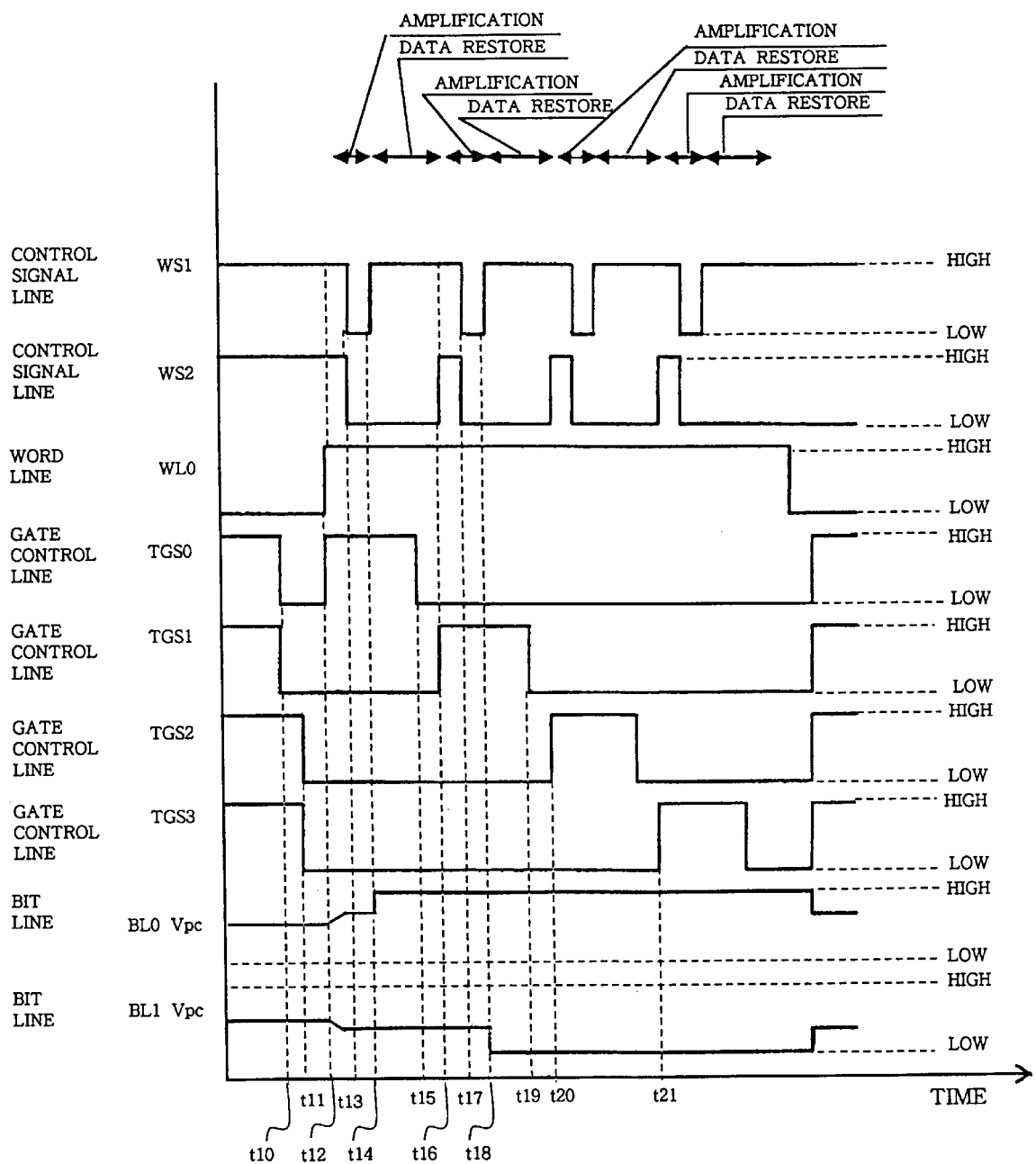
FIG. 8 is a timing chart showing a sequential data transfer between bit line pairs and a sense amplifier.
Figure 9:
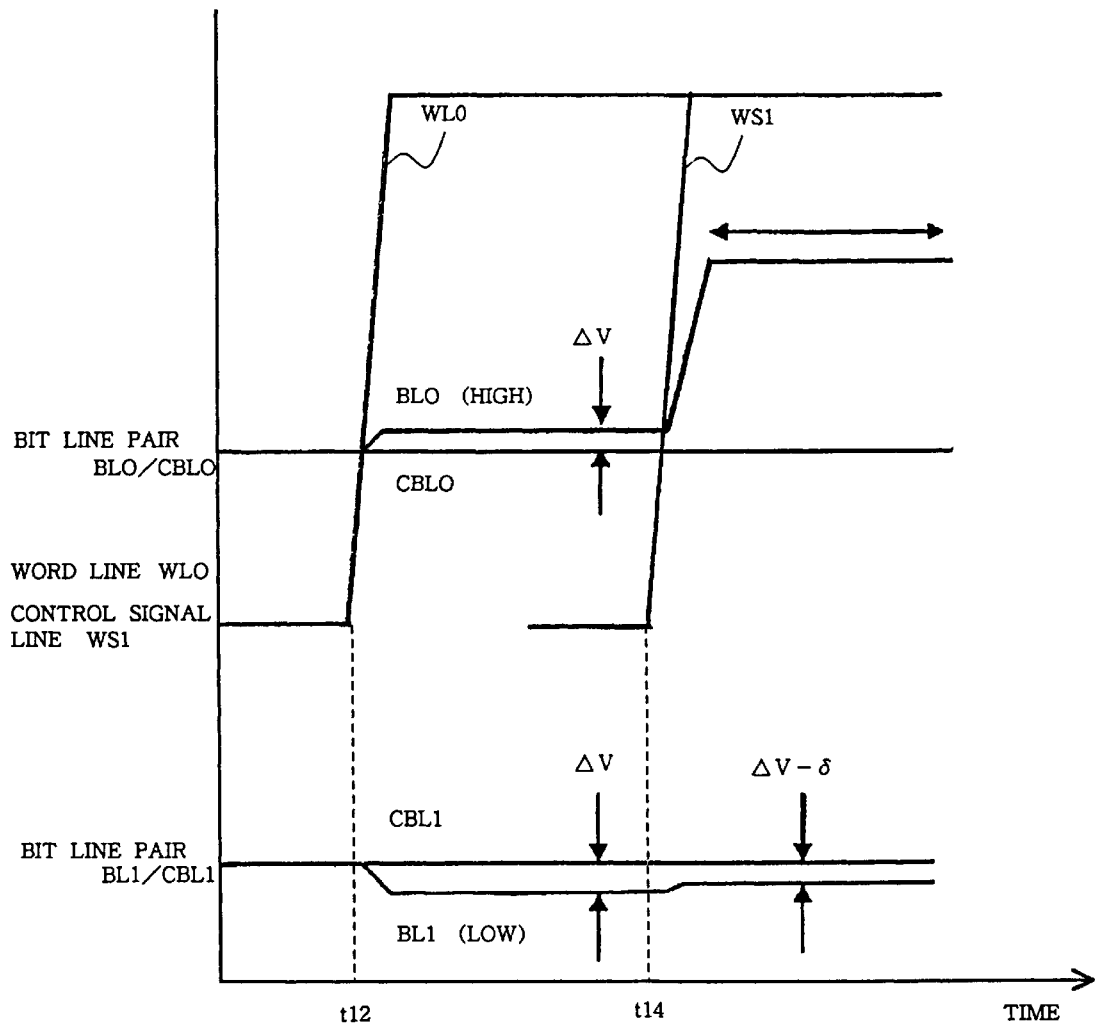
FIG. 9 is a graph showing the potential levels on adjacent two bit line pairs.

The behavior of the second embodiment is illustrated in FIG. 8, and the influence of the noise is illustrated in FIG. 9. While the read-out data is restored in the memory cell CL0, the high voltage level representative of the read-out data bit is supplied from the input node through the n-channel enhancement type switching transistor SW1 and the transfer gate TG0 to the memory cell CL0. However, the other n-channel enhancement type switching transistor SW3 is turned off, and the bit line CBL0 is maintained at the precharge level Vpc. For this reason, the high voltage level on the bit line BL0 induces the noise σ on the adjacent bit line BL0, and the noise σ decreases the potential level on the adjacent bit line BL1. However, the adjacent bit line CBL1 stays at the precharge level Vpc, and the small potential difference ΔV is decreased by σ. Thus, although the adjacent bit line pair BL1/CBL1 is affected by the noise σ, the decrement is less than that of the prior art. The advantage of the second embodiment is that the circuit arrangement is simple and, accordingly, the manufacturer can reduce the semiconductor chip size.

Third Embodiment

Figure 10:
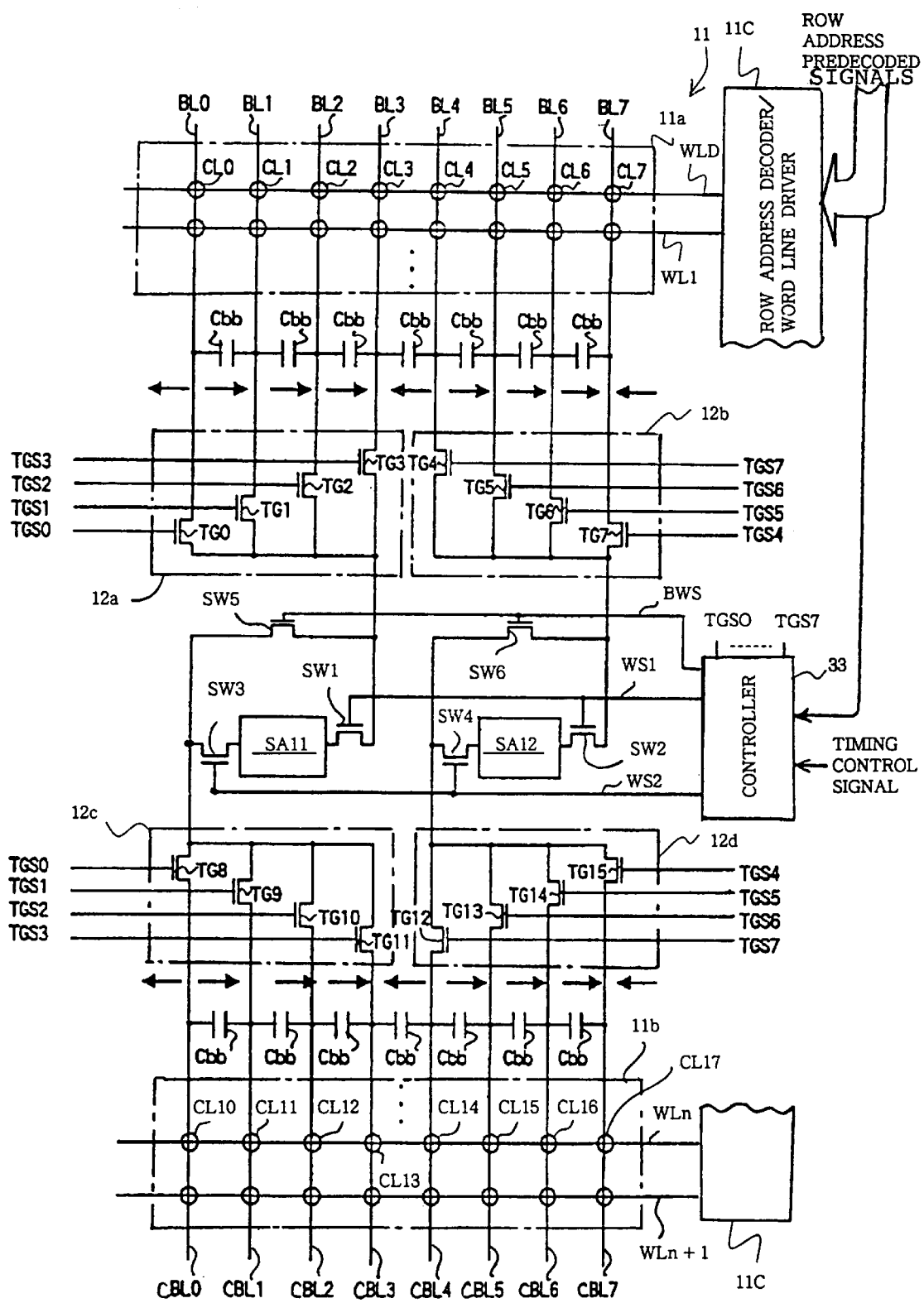
FIG. 10 is a circuit diagram showing the arrangement of yet another semiconductor dynamic random access memory device according to the present invention.

FIG. 10 illustrates yet another semiconductor dynamic random access memory device embodying the present invention, and the semiconductor dynamic random access memory device implementing the third embodiment is similar to the first embodiment except for a controller 33. The controller 33 changes the gate control lines TGS0–TGS3 and TGS4–TGS7 in such a manner that any bit line pair is subjected to the electrical influence twice.

Figure 11:
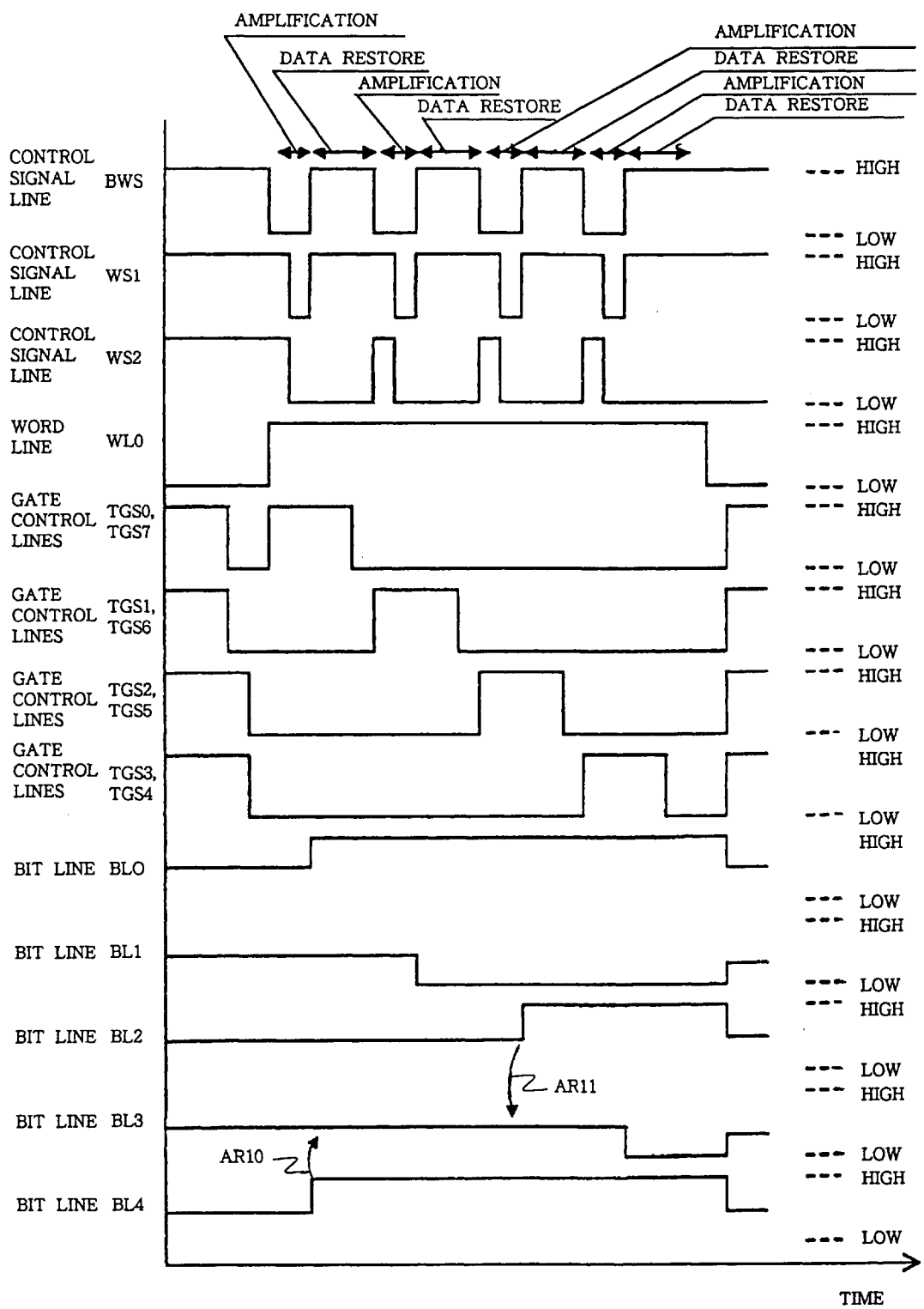
FIG. 11 is a timing chart showing a sequential data transfer between the bit line pairs and sense amplifiers.

In detail, if a controller changes the gate control lines TGS0 to TGS7 to the active level in the following order from TGS0/TGS7 through TGS1/TGS6 and TGS2/TGS5 to TGS3/TGS4 as shown in FIG. 11, the bit line BL4 firstly affects the bit line BL3 as indicated by arrow AR10, and, thereafter, the bit line BL2 affects the bit line BL3 as indicated by arrow AR11. Thus, the bit lines BL3/BL5 are affected twice during the sequential data transfer.

Figure 12:
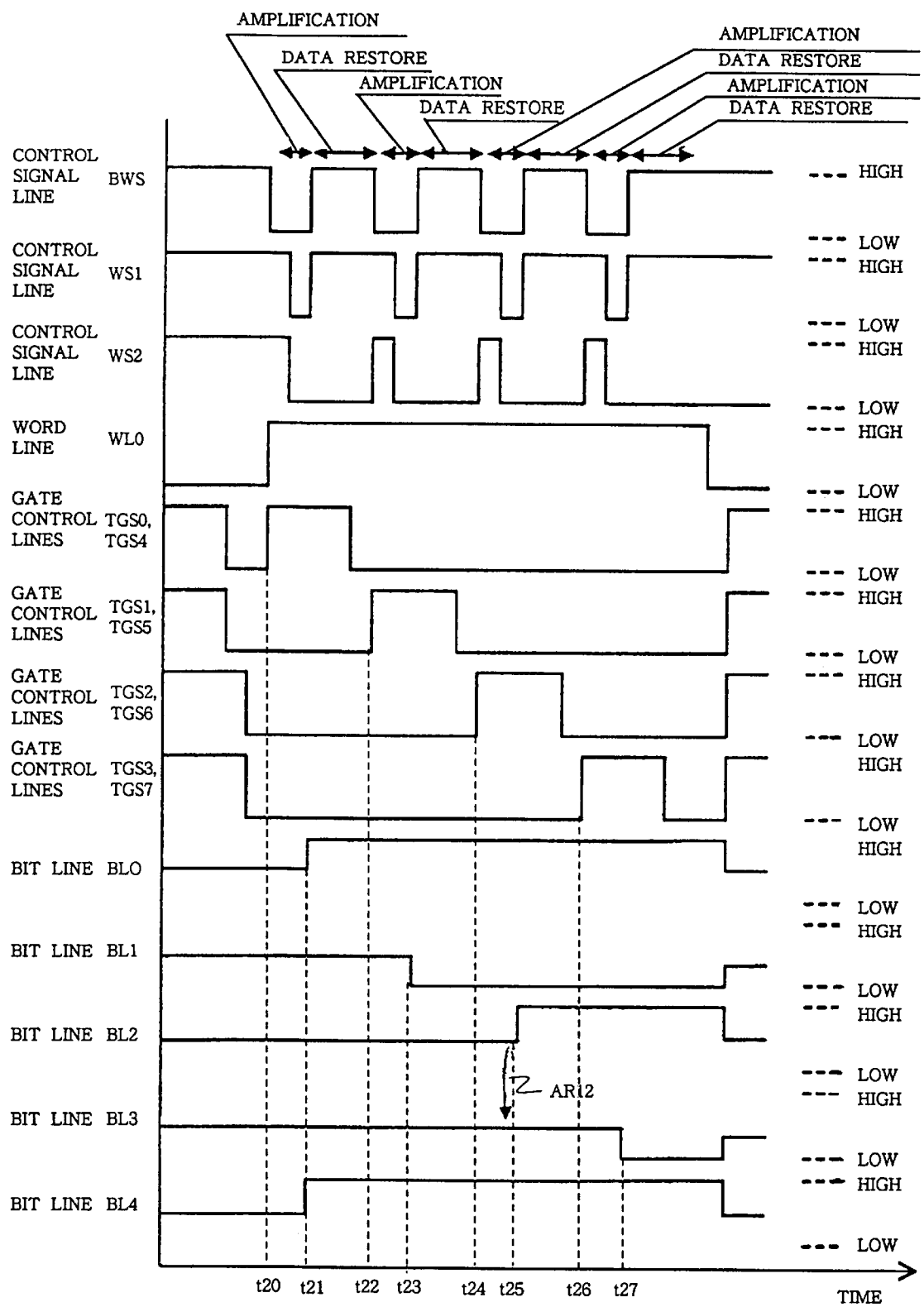
FIG. 12 is a timing chart showing another sequential data transfer between the bit line pairs and the sense amplifiers.

In order to prevent the bit lines BL3/BL5 from the multiple electrical influence, the controller 33 controls the gate control lines TGS0 to TGS7 as shown in FIG. 12. The controller 33 sequentially changes the gate control lines TGS0/TGS4, TGS1/TGS5, TGS2/TGS6 and TGS3/TGS7 at time t20, time t22, time t24 and time t26, respectively, and the sense amplifiers SA11/SA12 increase the potential differences on the bit line pairs connected thereto.

The controller 33 changes the control signal lines BWS/WS1 to the active level at time t21, time t23, time t25 and time t27, and the high/low voltage level is sequentially supplied from the sense amplifiers SA11/SA12 to the bit line pairs. As a result, only the bit line pairs BL2/CBL2 and BL5/CBL5 affect the adjacent bit line pairs BL3/CBL3 and BL4/CBL4, respectively, as indicated by arrow AR, and the electrical influence is reduced to once.

The controller 33 is desirable for the second embodiment, because the noise σ decreases the small potential difference ΔV once.

As will be understood, the controller 33 further reduces the electrical influence on the adjacent bit lines.

Fourth Embodiment

Figure 13:
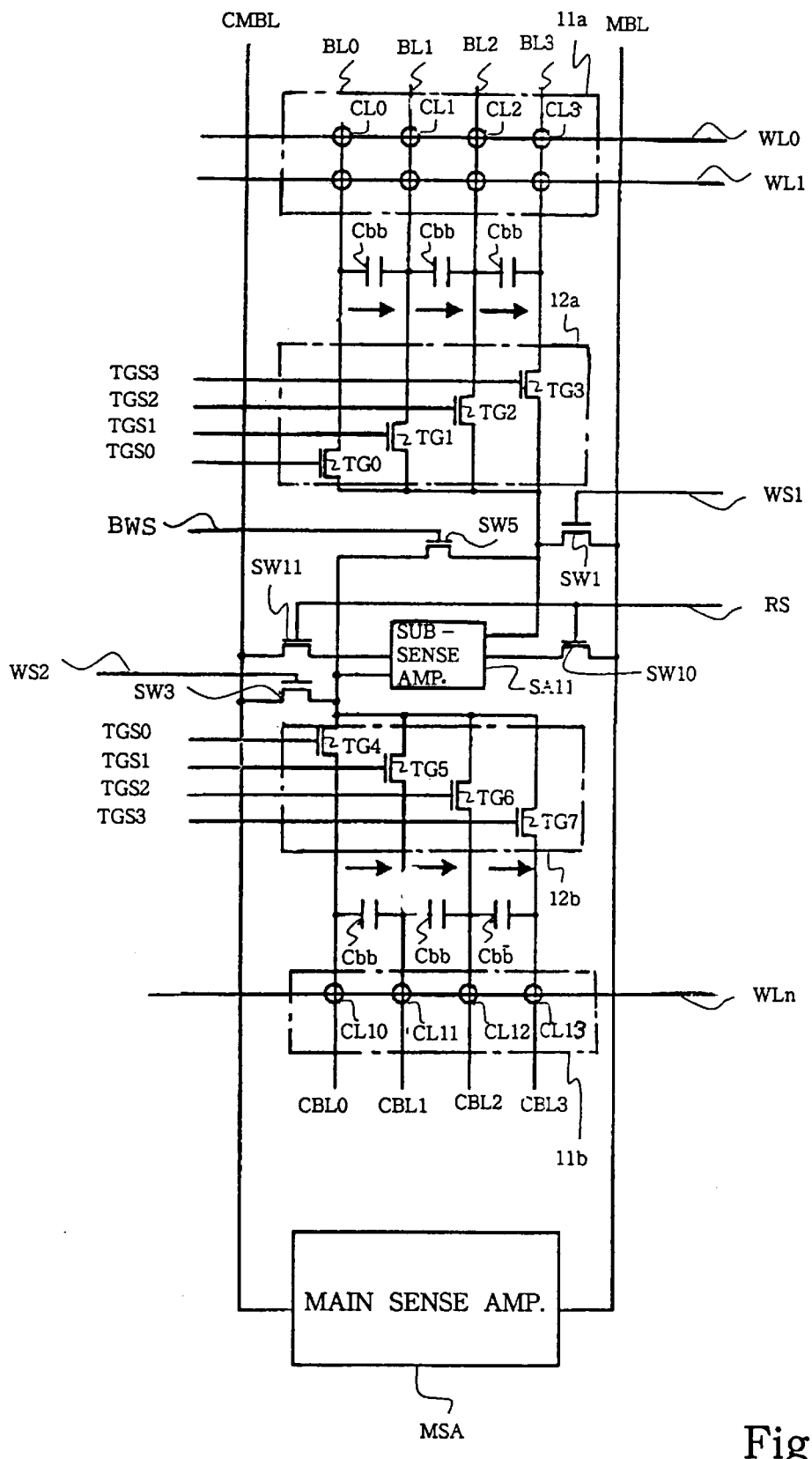
FIG. 13 is a circuit diagram showing the circuit arrangement of still another semiconductor dynamic random access memory device according to the present invention.

FIG. 13 illustrates still another semiconductor dynamic random access memory device embodying the present invention. The semiconductor dynamic random access memory device comprises a main bit line pair MBL/CMBL and a main sense amplifier MSA connected to the main bit line pair MBL/CMBL for increasing the magnitude of potential difference on the main bit line pair MBL/CMBL. Sub-bit line pairs, a sub sense amplifier, word lines, memory cell sub-arrays and transfer gate arrays are corresponding to those of the first embodiment, and are labeled with the same references. The main bit lines MBL/CMBL are folded bit lines, and sub-bit lines BL0/CBL0 to BL3/CBL3 are open bit lines. The n-channel enhancement type switching transistors SW1/SW2 are connected between the nodes of the sub-sense amplifier SA11 and the main bit lines MBL/CMBL.

Figure 14:
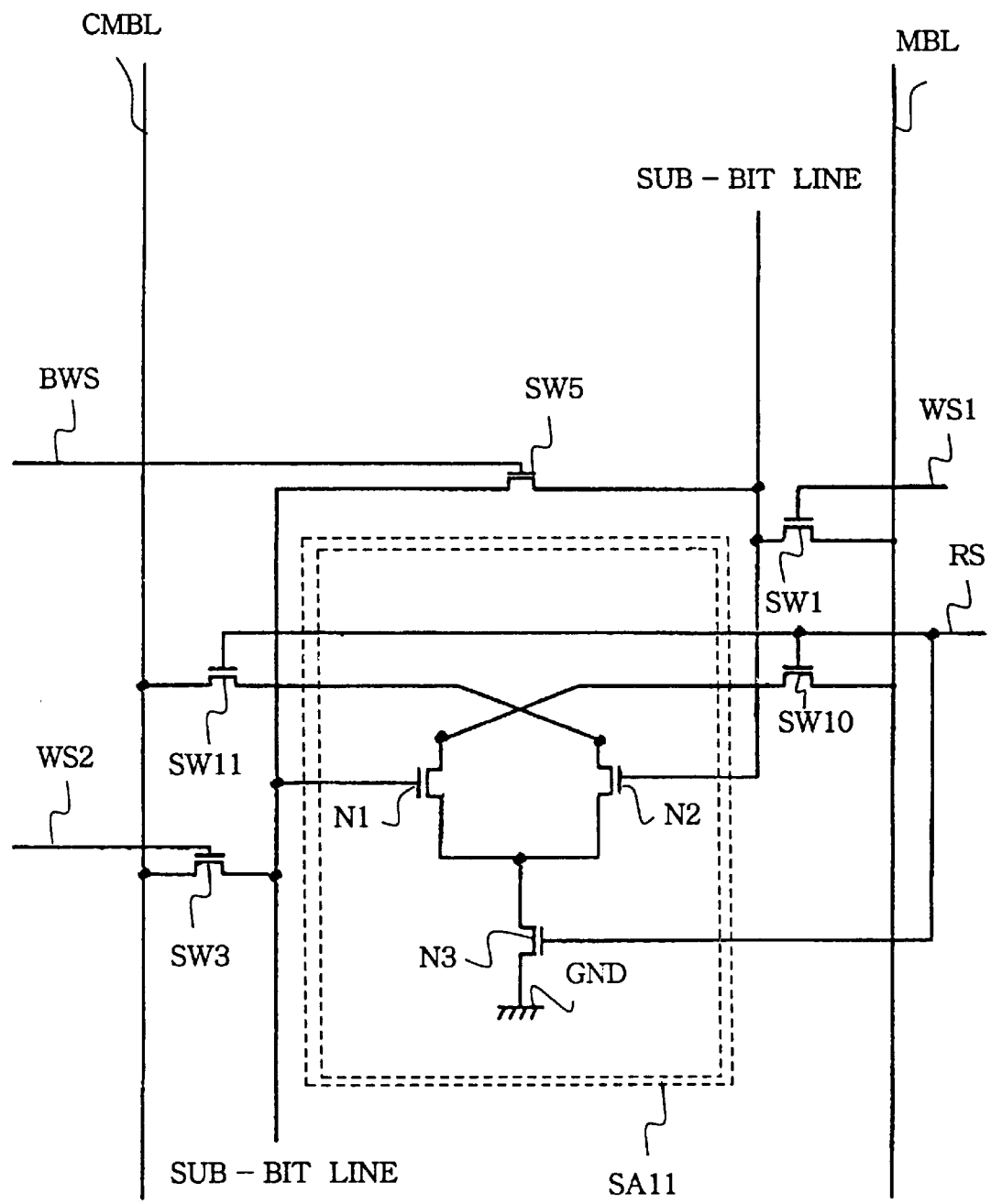
FIG. 14 is a circuit diagram showing the circuit configuration of a subsense amplifier incorporated in the semiconductor dynamic random access memory device shown in FIG. 13.
Figure 15:
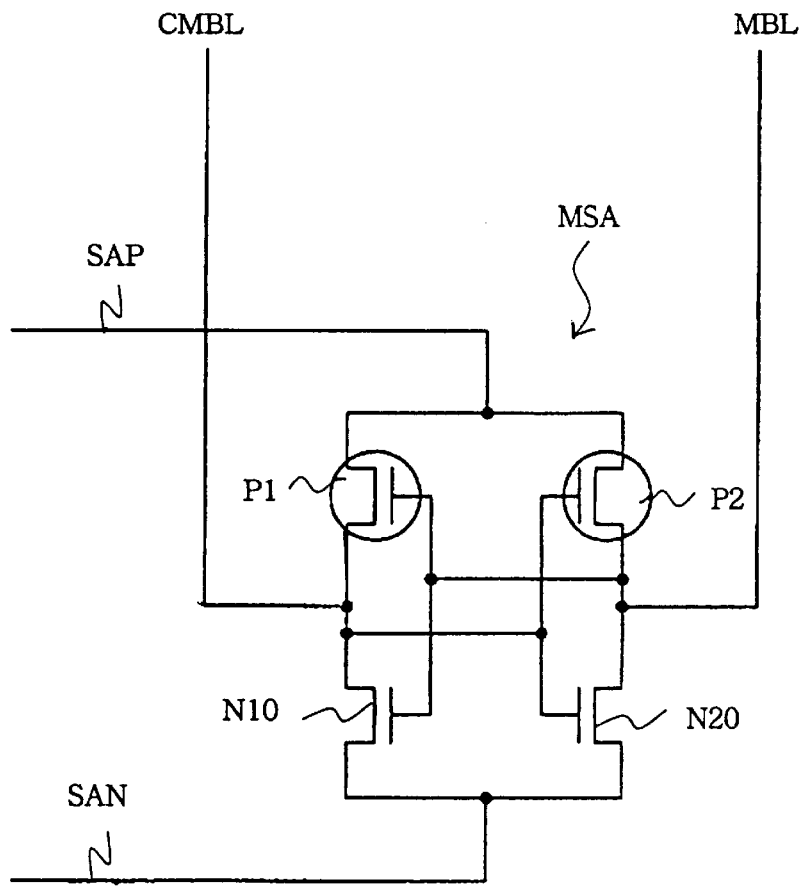
FIG. 15 is a circuit diagram showing the circuit configuration of a main sense amplifier incorporated in the semiconductor dynamic random access memory device shown in FIG. 13.

The sub-sense amplifier SA11 is illustrated in FIG. 14. The sub-sense amplifier SA11 includes a parallel combination of n-channel enhancement type amplifying transistors N1/N2 and an n-channel enhancement type switching transistor N3 connected between the n-channel enhancement type amplifying transistors N1/N2 and a ground line GND. Selected sub-bit lines are connected to the gate electrodes of the n-channel enhancement type switching transistors N1/N2, and a control signal line RS is connected to the gate electrode of the n-channel enhancement type switching transistor N3. The n-channel enhancement type amplifying transistors N1/N2 are connected through n-channel enhancement type switching transistors SW10/SW11 to the main bit lines MBL/CMBL, respectively, and the control signal line RS is also connected to the gate electrodes of the n-channel enhancement type switching transistors SW10/SW11.

When the control signal line RS is changed to the active high level, the n-channel enhancement type switching transistors N3 and SW10/SW11 turn on, and the sub-sense amplifier SA11 is activated. The small potential difference on the selected sub-bit line pair makes the channel conductance between the n-channel enhancement type switching transistors N1 and N2 different, and the sub-sense amplifier SA11 generates large potential difference on the main bit line pair MBL/CMBL.

The main sense amplifier MSA includes a first series combination of a p-channel enhancement type field effect transistor P1 and an n-channel enhancement type field effect transistor N10 connected between a first power supply line SAP and a second power supply line SAN and a second series combination of a p-channel enhancement type field effect transistor P2 and an n-channel enhancement type field effect transistor N20 also connected between the first power supply line SAP and the second power supply line SAN. The main bit line MBL is connected to the common drain node of the second series combination and the gate electrodes of the first series combination. On the other hand, the main bit line CMBL is connected to the common drain node of the first series combination and the gate electrodes of the second series combination. When the main sense amplifier MSA is powered by the power supply lines SAP/SAN, the first series combination and the second series combination selectively connect the main bit lines MBL/CMBL to the power supply lines SAP/SAN, and increases the magnitude of the potential difference on the main bit lines MBL/CMBL.

As similar to the first embodiment, either high or low level representative of the read-out data bit is transferred to the sub-bit lines of the selected pair. If the read-out data bit is transferred from the memory cell sub-array 11a to the sub-sense amplifier SA11, the control signal lines BWS/

WS1 are changed to the active level after the sense amplification, and either high or low level is transferred from the main bit line MBL through the n-channel enhancement type switching transistor SW1 and the transfer gate array 12a to the memory cell sub-array 11a, and is further transferred through the n-channel enhancement type switching transistor SW5 and the transfer gate array 12b to the associated sub-bit line. If only the control signal line WS1 is changed to the active high level, either high or low level is transferred to the bit line.

Figure 16:
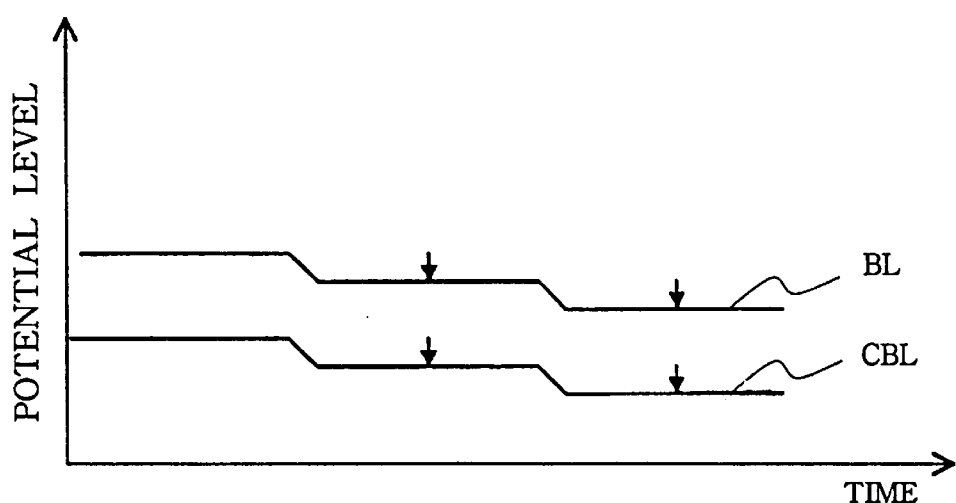
FIG. 16 is a graph showing the potential variation on a bit line pair during a sequential data transfer.

If a sub-bit line pair BL/CBL are repeatedly affected by the adjacent bit line pairs as shown in FIG. 16, the potential difference is moved toward the low level, and makes the difference of current driving capability between the n-channel enhancement type amplifying transistors N1/N2 small. This results in that reduction of the magnitude of potential difference on the main bit line pair MBL/CMBL. For this reason, the controlling sequence described with reference to FIG. 12 is also desirable for the fourth embodiment.

Although particular embodiments of the present invention have been shown and described, it will be obvious to those skilled in the art that various changes and modifications may be made without departing from the spirit and scope of the present invention.

For example, the present invention does not limit the memory cells to the dynamic cell storing a data bit in the form of electric charge. Any kind of memory cell is available for the semiconductor memory device in so far as the semiconductor memory device has shared sense amplifiers and the open bit line scheme.

A semiconductor memory device may have more than one memory cell array, and more than two sense amplifiers may be incorporated in the semiconductor memory device.

The n-channel enhancement type field effect transistors SW1–SW4 may be connected between the bit lines BL0–BL7/CBL0–CBL7 and the transfer gate arrays 12a–12d.

What is claimed is:

1. A semiconductor memory device comprising
   a plurality of first addressable memory cells forming at least two first memory cell sub-arrays and storing data bits, respectively,
   a plurality of word lines selectively connected to said plurality of first addressable memory cells for selecting certain first addressable memory cells from one of said at least two first memory cell sub-arrays,
   at least one first sense amplifier having a first node and a second node for amplifying a potential difference representative of a data bit between said first node and said second node,
   a plurality of first bit lines selectively connected to the first addressable memory cells of one of said at least two first memory cell sub-arrays and providing essential parts of first signal propagation paths connected between said certain first addressable memory cells and said first node of said at least one first sense amplifier,
   a plurality of second bit lines selectively connected to the first addressable memory cells of the other of said at least two first memory cell sub-arrays, providing essential parts of second signal propagating paths connected between said certain first addressable memory cells and said second node of said at least one first sense amplifier and respectively paired with said plurality of first bit lines so as to form first bit line pairs,
   a first transfer gate array forming first additional parts of said first signal propagation paths and selectively connecting said plurality of first bit lines to said first node of said at least one first sense amplifier,
   a second transfer gate array forming second additional parts of said second signal propagation paths and selectively connecting said plurality of second bit lines to said second node of said at least one first sense amplifier,
   a first switching means inserted into said first signal propagation paths and changed between on-state and off-state,
   a second switching means inserted into said second signal propagation paths and changed between said on-state and said off-state, and
   a controller connected to said first transfer gate array, said second transfer gate array, said first switching means and said second switching means and operative to cause said first transfer gate array and said second transfer gate array to sequentially connect said first bit line pairs to said first and second nodes of said at least one first sense amplifier and independently control said first switching means and said second switching means between said on-state and said off-state so as to electrically isolate either first or second bit line of selected one of said first bit line pairs from the associated first or second node of said at least one sense amplifier.

2. The semiconductor memory device as set forth in claim 1, in which said controller causes said first transfer gate array, said second transfer gate array, said first switching means and said second switching means to connect one of said first bit line pairs to said first node and said second node, said first switching means and said second switching means to isolate said one of said first bit line pairs from said first node and said second node for increasing the magnitude of said potential difference representative of said data bit between said first node and said second node, and one of said first switching means and said second switching means to transfer a potential level representative of said data bit to the associated first or second bit line.

3. The semiconductor memory device as set forth in claim 1, in which said first switching means and said second switching means are a first switching transistor connected between said first node and said first transfer gate array and a second switching transistor connected between said second node and said second transfer gate array, respectively.

4. The semiconductor memory device as set forth in claim 2, further comprising a third switching means connected between said first switching means and said second switching means and controlled by said controller, and said controller causes said third switching means to electrically connect said first bit line and said second bit line of said one of said first bit line pairs when said one of said first switching means and said second switching means transfers said potential level to said associated first or second bit line.

5. The semiconductor memory device as set forth in claim 4, in which said first switching means, said second switching means and said third switching means are a first switching transistor connected between said first node and said first transfer gate array, a second switching transistor connected between said second node and said second transfer gate array and a third switching transistor connected between said first transfer gate array and said second transfer gate array, respectively.

6. The semiconductor memory device as set forth in claim 1, further comprising
   a plurality of second addressable memory cells forming at least two second memory cell sub-arrays for storing data bits, respectively, and selectively connected to said plurality of word lines so as to select certain second addressable memory cells from one of said at least two second memory cell sub-arrays, at least one second sense amplifier having a third node and a fourth node for amplifying a potential difference representative of a data bit between said third node and said fourth node, a plurality of third bit lines selectively connected to the second addressable memory cells of one of said at least two second memory cell sub-arrays, providing essential parts of third signal propagation paths connected between said certain second addressable memory cells and said third node of said at least one second sense amplifier and adjacent to said plurality of first bit lines, a plurality of fourth bit lines selectively connected to the second addressable memory cells of the other of said at least two second memory cell sub-arrays, providing essential parts of fourth signal propagating paths connected between said certain second addressable memory cells and said fourth node of said at least one second sense amplifier, adjacent to said plurality of second bit lines and respectively paired with said plurality of third bit lines so as to form second bit line pairs, a third transfer gate array forming third additional parts of said third signal propagation paths and controlled by said controller so as to selectively connect said plurality of third bit lines to said third node of said at least one second sense amplifier, a fourth transfer gate array forming fourth additional parts of said fourth signal propagation paths and controlled by said controller so as to selectively connect said plurality of fourth bit lines to said fourth node of said at least one second sense amplifier, a third switching means inserted into said third signal propagation paths and changed between said on-state and said off-state by said controller, and a fourth switching means inserted into said fourth signal propagation paths and changed between said on-state and said off-state by said controller, said controller causing said first and second transfer gate arrays and said third and fourth transfer gate arrays to sequentially connect said first bit line pairs and said second bit line pairs to said at least one first sense amplifier and said at least one second sense amplifier in such a manner as to select the first bit line pair and the second bit line pair from the outermost position toward the innermost position closest to a boundary between said first bit line pairs and said second bit line pairs.

7. The semiconductor memory device as set forth in claim 6, in which said controller causes said first and third transfer gate arrays, said second and fourth transfer gate arrays, said first and third switching means and said second and fourth switching means to connect one of said first bit line pairs and one of said second bit line pairs to said first and second nodes and said third and fourth nodes, said first and third switching means and said second and fourth switching means to isolate said one of said first bit line pairs and said one of said second bit line pairs from said first and second nodes and said third and fourth nodes for increasing the magnitude of said potential difference representative of said data bit between said first node and said second node and the magnitude of said potential difference representative of said data bit between said third node and said fourth node, and one of said first switching means and said second switching means and one of said third switching means and said fourth switching means to transfer a potential level representative of said data bit and a potential level representative of said data bit from either first or second node and either third or fourth node to the associated first or second bit line and the associated third or fourth bit line, respectively.

8. The semiconductor memory device as set forth in claim 6, in which said first switching means, said second switching means, said third switching means and said fourth switching means are a first switching transistor connected between said first node and said first transfer gate array, a second switching transistor connected between said second node and said second transfer gate array, a third switching transistor connected between said third node and said third transfer gate array and a fourth switching transistor connected between said fourth node and said fourth transfer gate array, respectively.

9. The semiconductor memory device as set forth in claim 7, further comprising a fifth switching means connected between said first switching means and said second switching means and a sixth switching means connected between said third switching means and said fourth switching means both controlled by said controller, and said controller causes said fifth switching means and said sixth switching means to electrically connect the selected first bit line and the selected third bit line to the selected second bit line and the selected fourth bit line, respectively, when said one of said first switching means and said second switching means and said one of said third switching means and said fourth switching means respectively transfer said potential levels to said associated first or second bit line and said associated third or fourth bit line.

10. The semiconductor memory device as set forth in claim 9, in which said first switching means, said second switching means and said fifth switching means are a first switching transistor connected between said first node and said first transfer gate array, a second switching transistor connected between said second node and said second transfer gate array and a third switching transistor connected between said first transfer gate array and said second transfer gate array, respectively, and said third switching means, said fourth switching means and said sixth switching means are a fourth switching transistor connected between said third node and said third transfer gate array, a fifth switching transistor connected between said fourth node and said fourth transfer gate array and a sixth transistor connected between said third transfer gate array and said fourth transfer gate array, respectively.

11. The semiconductor memory device as set forth in claim 1, in which said first switching means and said second switching means are connected between said first node and a main bit line and between said second node and another main bit line paired with said main bit line, and said at least one first sense amplifier further has a third node connected through a third switching means to said main bit line and a fourth node connected through a fourth switching means to said another main bit line so as to generate a potential difference between said main bit line and said another main bit line in response to said potential difference between said first node and said second node.

12. The semiconductor memory device as set forth in claim 11, in which a main sense amplifier is further connected between said main bit line and said another main bit line so as to increase the magnitude of said potential difference therebetween, and a fifth switching means is connected between said first node and said second node so as to electrically connect said first bit line of said selected one of said first bit line pairs to said second bit line of said selected one of said first bit line pairs.

* * * * *